(12) United States Patent
Kizilyalli et al.

(10) Patent No.: US 6,335,557 B1
(45) Date of Patent: Jan. 1, 2002

(54) METAL SILICIDE AS A BARRIER FOR MOM CAPACITORS IN CMOS TECHNOLOGIES

(75) Inventors: Isik C. Kizilyalli; Sailesh M. Merchant; Joseph R. Radosevich, all of Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/441,561

(22) Filed: Nov. 17, 1999

(51) Int. Cl.$^7$ ................................................. H01L 29/00
(52) U.S. Cl. ........................ 257/532; 257/301; 257/534; 257/7.1
(58) Field of Search .................. 257/68, 71, 295–313, 257/301–305, 534, 599, 532

(56) References Cited

U.S. PATENT DOCUMENTS

| | | | |
|---|---|---|---|
| 5,869,901 A | * | 2/1999 | Kusuyama .................. 257/763 |
| 5,985,731 A | | 11/1999 | Weng et al. |
| 6,040,616 A | | 3/2000 | Dennis et al. ............................ |

* cited by examiner

Primary Examiner—Nathan Flynn
Assistant Examiner—Scott R. Wilson

(57) ABSTRACT

The present invention provides a semiconductor device having a metal oxide metal (MOM) capacitor formed over a semiconductor wafer. In one embodiment, the device is a MOM capacitor that includes a first metal layer formed over the semiconductor wafer, a metal silicide layer, such as a tungsten silicide, silicide nitride or a refractory metal silicide, located on the first metal layer and an oxide layer located on the metal silicide layer. The metal silicide layer, which in an advantageous embodiment may be tungsten silicide nitride, resists the corrosive effects of deglazing that may be conducted on other portions of the wafer and is substantially unaffected by the deglazing process, unlike titanium nitride (TiN). Additionally, the metal silicide can act as an etch stop for the etching process. The MOM capacitor is completed by a second metal layer that is located on the oxide layer.

20 Claims, 4 Drawing Sheets

METAL SILICIDE AS A BARRIER FOR MOM CAPACITORS IN CMOS TECHNOLOGIES

TECHNICAL FIELD OF THE INVENTION

The present invention is directed, in general to a semiconductor barrier and, more specifically, to a semiconductor barrier for metal-oxide-metal capacitors in sub-0.5 micron CMOS technologies.

BACKGROUND OF THE INVENTION

Metal-oxide-metal (MOM) capacitors are frequently formed during the manufacture of complementary metal oxide semiconductor (CMOS) devices. One who is skilled in the art is readily aware that a capacitor comprises two conductive surfaces separated by a dielectric. In semiconductor manufacture, MOM capacitors in CMOS devices are commonly formed on a silicon substrate by depositing a first metal layer of titanium (Ti), followed by a titanium nitride (TiN) barrier layer. Typically, silane-based oxide is deposited to form the dielectric. The oxide layer is then deposited, masked and etched. In those areas where MOM capacitors are not required, the oxide is etched away and down to the TiN barrier layer. During the removal of the photoresist layer defining the MOM capacitor, a portion of the TiN barrier oxidizes, which requires a deglaze (oxide removal) step prior to deposition of the top metal plate. Finally, the second metal layer, which may be aluminum (Al), copper (Cu), or aluminum copper alloy, such as AlCU(Si), is deposited to form the MOM capacitor.

A problem arises, however, during the oxide deglaze process in that the deglaze chemistry attacks the oxidized TiN barrier layer where it has been exposed. This causes the TiN barrier layer to erode in those exposed areas. The erosion of TiN material may be as much as 10 nm to 50 nm. The conventional solution to this problem has been to deposit a thicker TiN layer in order to compensate for this corrosive loss. However, a thicker metal/nitride layer increases the overall sheet resistance of the metal stack—an undesirable side effect. An additional problem results from this TiN layer erosion in that when the TiN layer is attacked, the silicon dopants, such as boron, phosphorus and arsenic, and titanium itself may diffuse through the eroded TiN barrier and into the upper or top metal layer. This diffusion can result in junction spiking. All of these problems result in reduced die yield, and increased manufacturing costs.

Additionally, while the titanium layer acts as a good adherent, it does, however, affect the subsequent grain size of the aluminum, aluminum/copper or aluminum/copper/silicon electrode layers of the contact plug. This, in turn, can reduce the conductivity of the aluminum stack layer.

Accordingly, what is needed in the art is a barrier material for MOM capacitors that addresses the deficiencies of the prior art.

SUMMARY OF THE INVENTION

To address the above-discussed deficiencies of the prior art, the present invention provides a semiconductor device having a metal oxide metal (MOM) capacitor formed over a semiconductor wafer. In one embodiment, the device is a MOM capacitor that includes a first metal layer formed over the semiconductor wafer, a metal silicide layer, such as a tungsten silicide, silicide nitride or a refractory metal silicide, located on the first metal layer and an oxide layer located on the metal silicide layer. The metal silicide layer, which in an advantageous embodiment may be tungsten silicide nitride, resists the corrosive effects of deglazing that may be conducted on other portions of the wafer and is substantially unaffected by the deglazing process, unlike titanium nitride (TiN). Additionally, the metal silicide can act as an etch stop for the etching process. The MOM capacitor is completed by a second metal layer that is located on the oxide layer.

In certain embodiments, the first metal layer may be titanium (Ti), but the first metal layer may also be a metal stack of titanium/titanium nitride (Ti/TiN), and in another embodiment, the oxide layer may be a silane-based oxide. The second metal layer may be an aluminum layer, an aluminum/copper alloy layer, an aluminum/copper/silicon stack layer or similar combinations of materials.

In another aspect, the present invention provides an integrated circuit formed on a semiconductor wafer. In one particular embodiment integrated circuit include a transistor, such as a comparable metal oxide semiconductor (CMOS) transistor that is formed on the semiconductor wafer and a MOM capacitor that is electrically connected to the transistor. The MOM capacitor includes a first metal layer located over the semiconductor wafer, a metal silicide layer located on the first metal layer, an oxide layer located on the metal silicide layer, and a second metal layer located on the oxide layer. The MOM capacitor may be formed in the same manner that the above-discussed embodiments are formed.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and broadest scope of the invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
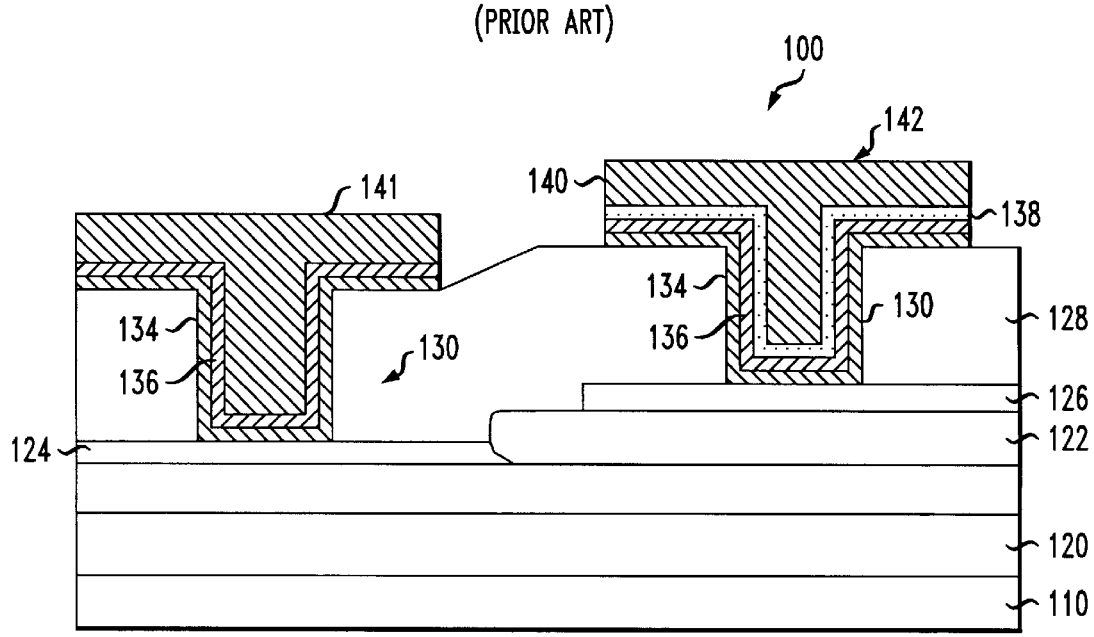
FIG. 1 illustrates a sectional view of a conventional semiconductor device at an intermediate stage of manufacture a sectional view of a conventional semiconductor device at an intermediate stage of manufacture.

Referring initially to FIG. 1, illustrated is a sectional view of a conventional semiconductor device at an intermediate stage of manufacture. A semiconductor device, generally designated 100, is formed over a semiconductor wafer 110 and comprises a silicon substrate 120, a field oxide region 122, a source/drain region 124 and a poly-silicon layer 126. The field oxide region 122, source/drain region 124 and the poly-silicon layer (gate) 126 form an active area of a conventional transistor, such as a complementary metal oxide semiconductor (CMOS) transistor. A dielectric layer 128 overlays the active area. Contact structures 130 are located within openings that have been formed within the dielectric layer 128. The contact structures each include a barrier layer 132 that typically includes a titanium layer (Ti) 134 overlaid by a titanium nitride (TiN) layer 136. An oxide layer 138 is conventionally formed over the Ti/TiN barrier layer 132. A conductive metal layer 140, such as aluminum, copper, aluminum/copper alloy or aluminum/copper/silicon, is formed over the oxide layer 138 to complete a metal-oxide-metal (MOM) capacitor 142 and an interconnect structure 141. The titanium metal layer 134 and the titanium nitride layer 136 stack form the first electrode and the oxide layer 138 forms the capacitor dielectric of the MOM capacitor 142. The conductive metal layer 140 serves as the second electrode of the MOM capacitor 142. One who is skilled in the art is familiar with the processes used to form the semiconductor device 100 at this stage of manufacture.

In these conventional structures, problems arise with the removing of the capacitor dielectric layers from area not defined by the MOM capacitor 142. The dielectric etch and subsequent photoresist removal step can degrade the TiN layer 136 and raise the contact resistance due, in part, to the conversion of some portion of the TiN layer 136 to an oxide of Ti. To remove this oxide, a deglazing is performed next, during which the semiconductor wafer 100 is subjected to a chemistry to deglaze the oxide in preparation for further depositions. Unfortunately, TiN is also affected by the corrosive effects of the oxide deglaze chemistry. This results in erosion of the TiN layer 136. If the TiN layer 136 is not of sufficient thickness, material from the second or subsequent top metal electrode 140 may migrate through the eroded TiN layer 136, resulting in junction spiking. Of course, this is unacceptable and results in wafer yield loss and increased manufacturing costs. If the TiN layer 136 is thickened to compensate for the anticipated TiN erosion, then the increase TiN layer 136 thickness can affect the conductivity of the second electrode 140 as previously mentioned.

Figure 2:
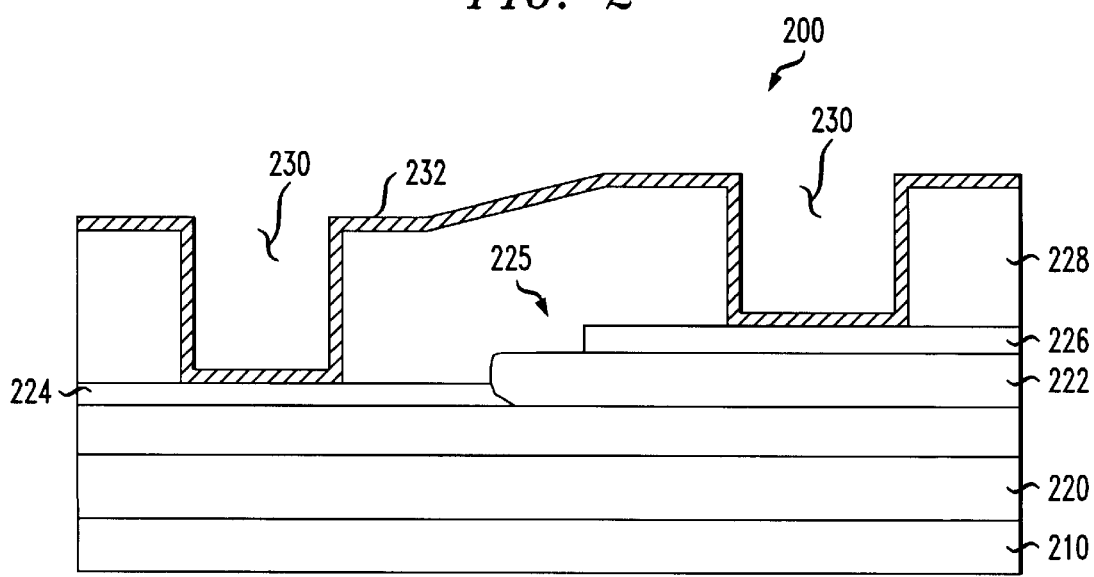
FIG. 2 illustrates a sectional view of one embodiment of a semiconductor device at an intermediate stage of manufacture constructed according to the principles of the present invention.

To address these problems, the present invention provides a unique MOM capacitor structure, which will now be discussed. Referring initially to FIG. 2, illustrated is a sectional view of one embodiment of a semiconductor device 200 at an intermediate stage of manufacture constructed according to the principles of the present invention. The semiconductor device 200 comprises a semiconductor wafer 210 over which is formed a silicon substrate 220. A field oxide region 222, a source/drain region 224 and a poly-silicon level 226 form a conventional transistor 225, such as a CMOS transistor. The field oxide region 222, source/drain region 224, and the poly-silicon level 226 form an active area of the conventional transistor, such as a CMOS transistor. A dielectric layer 228 overlays the active area. Contact openings 230 have been formed within the dielectric layer 228. Within the contact openings 230 is a conventionally formed first metal layer 232. The first metal layer 232 acts as an adherent subsequent metal layers. In one embodiment, the first metal layer 232 may be titanium. Of course, other metals, which are known to those who are skilled in the art, may also be used in place of titanium.

Figure 3:
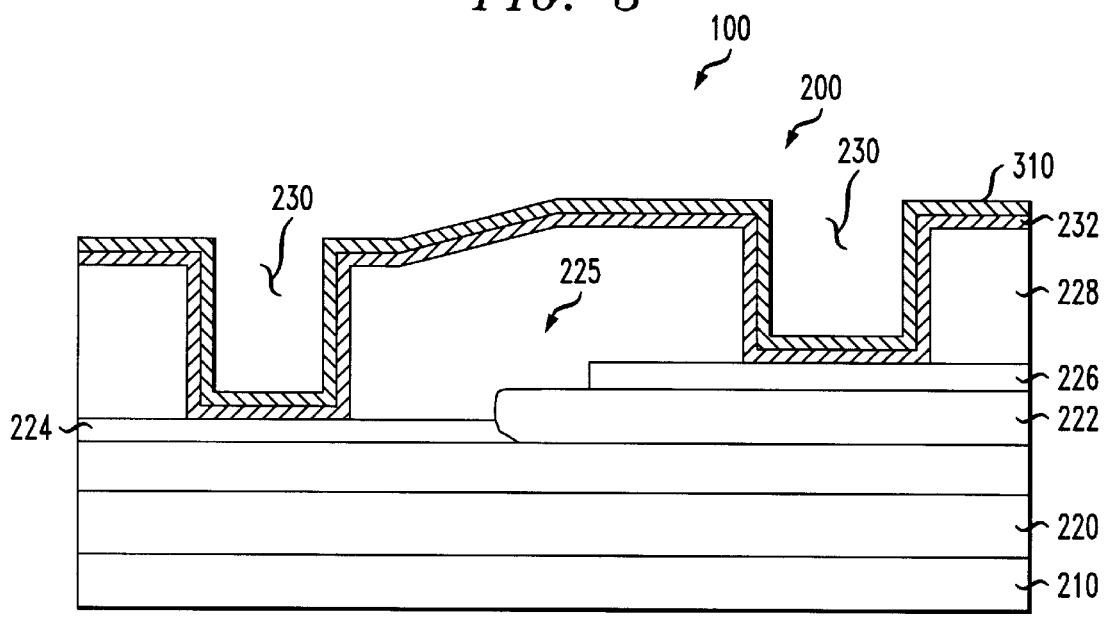
FIG. 3 illustrates a sectional view of the semiconductor device of FIG. 2 at a subsequent stage of manufacture.

Turning now to FIG. 3, there is illustrated a partial sectional view of the semiconductor device of FIG. 2 following 20 the conventional deposition of a second metal layer 310, which is preferably a TiN. The second metal layer 310 acts as a barrier to the diffusion of first metal layer 232 into the subsequent metal layers, and it must be of sufficient thickness to block the diffusion of the first metal layer 232. The first and second metal layers 232 and 310 form a stacked barrier layer and are conventionally deposited. Those who are skilled in the art are familiar with such deposition processes. As discussed below, the second metal layer 310 may be optional in certain embodiments and need not always be present. In such cases, however, another layer serves as the diffusion barrier, as discussed below.

Figure 4:
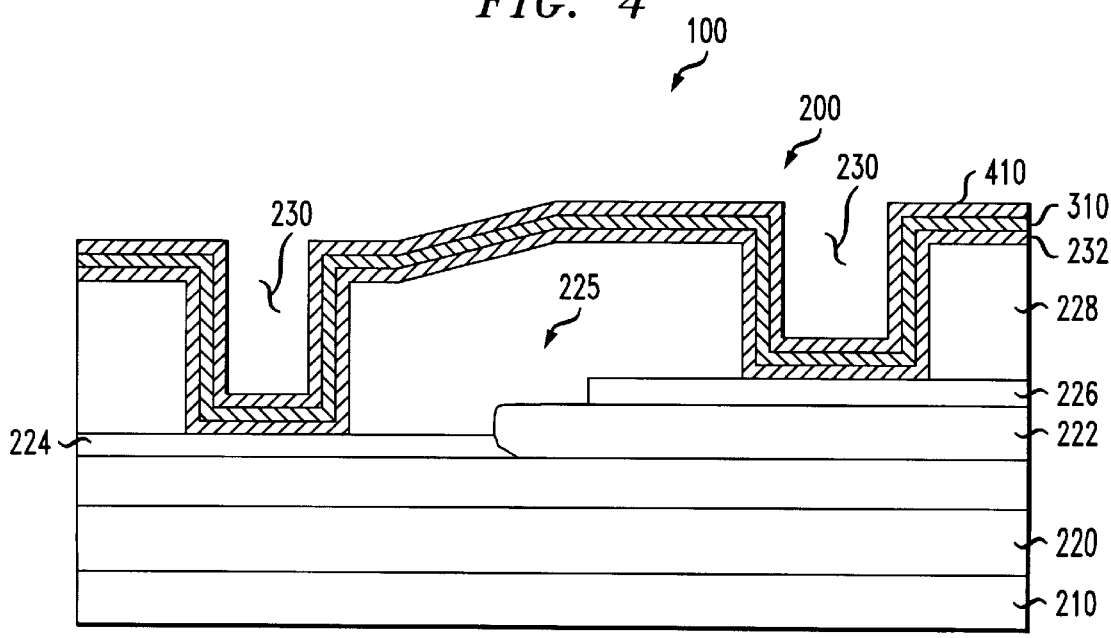
FIG. 4 illustrates a sectional view of the semiconductor device of FIG. 3 at a subsequent stage of manufacture.

Turning now to FIG. 4, there is illustrated a partial sectional view of the device of FIG. 3 following the deposition of a metal silicide layer 410. In advantageous embodiments, the metal silicide layer 410 is a silicide nitride and more specifically is a tungsten silicide nitride, which is formed using conventional physical vapor deposition (PVD) or chemical vapor deposition (CVD) methods. One who is skilled in the art will recognize that in alternative embodiments, other metal silicide compounds may be employed in place of the tungsten silicide nitride. For example, the metal may be selected from among the Group 5 or Group 6 metals of the Periodic Table of the Elements as specified by the new convention of the International Union of Pure and Applied Chemistry (IUPAC).

Figure 5A:
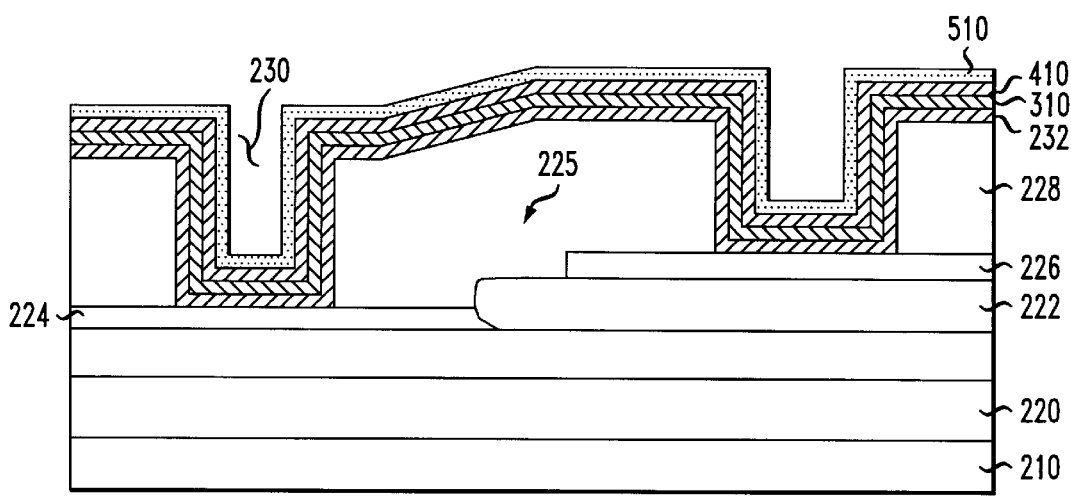
FIG. 5A illustrates a sectional view of the semiconductor device of FIG. 4 at a subsequent stage of manufacture.

Turning now to FIG. 5A, there is illustrated a partial sectional view of the device of FIG. 4, following the formation of a capacitor dielectric oxide layer 510. The oxide layer 510 may be a silane-based or other suitable oxide formed by conventional methods. As shown, the oxide layer 510 is blanket deposited over the device. Following the oxide layer's 510 deposition, the oxide layer 510 is conventionally patterned and etch away over the damascene structures that are not intended to function as capacitors.

Figure 5B:
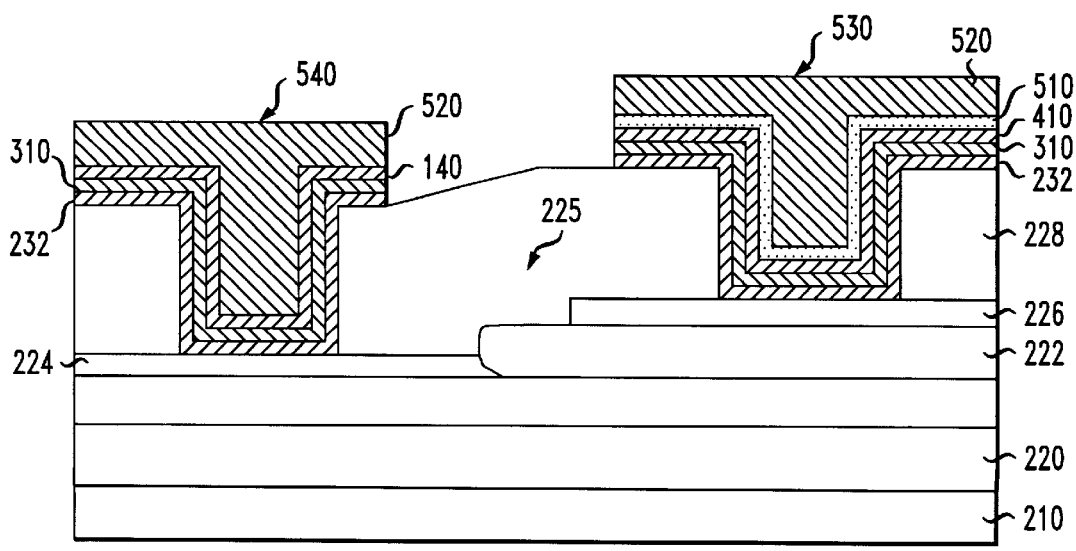
FIG. 5B illustrates a sectional view of the semiconductor device of FIG. 5 at a subsequent stage of manufacture.

FIG. 5B illustrates the device of FIG. 5A following the removal of a portion of the oxide layer 510 as explained above and the conventional blanket deposition of a second metal layer 520 layer after patterning to form a MOM capacitor 530 and a conventional interconnect structure 540, which in the illustrated embodiment, is a contact plug that contacts the source region 224 and the MOM capacitor 530 contacts the poly-silicon layer 226. The second metal layer 520 may comprise, for example, aluminum, tungsten, or more recently, copper or a stack of combinations of these metals. The second metal layer 520 forms the second electrode of the MOM capacitor and completes the metallization. Thus, a MOM capacitor 530 with improved resistance to junction spiking has been developed for sub-0.5 micron CMOS technologies.

It is believed that the addition of a thin (e.g., from about 10 nm to about 30 nm) metal silicide layer 410 stops the oxidation of the TiN barrier layer 310 that occurs during the photoresist removal. In conventional devices as those discussed above, the TiN is normally exposed to such oxidation processes. However, due to the metal silicide layer's 410 presence, the TiN is not exposed to the oxidation process. If the metal silicide layer 410 is coextensive with the TiN, the deglazing step can be omitted entirely, thereby, saving processing steps and expense. In those instances where the TiN layer extends beyond the perimeter of the metal silicide layer 410, the TiN is protected from the subsequent deglazing process.

It is also believed that the metal silicide layer 410 may add to the barrier properties of the TiN layer by stopping or slowing down the diffusion of silicon dopants, such as boron, phosphorous, or arsenic, and the diffusion of the Ti into the upper electrode of the MOM capacitor. An alternative solution, however, would be to replace the TiN barrier layer 310 with the metal silicide layer 410.

Figure 6:
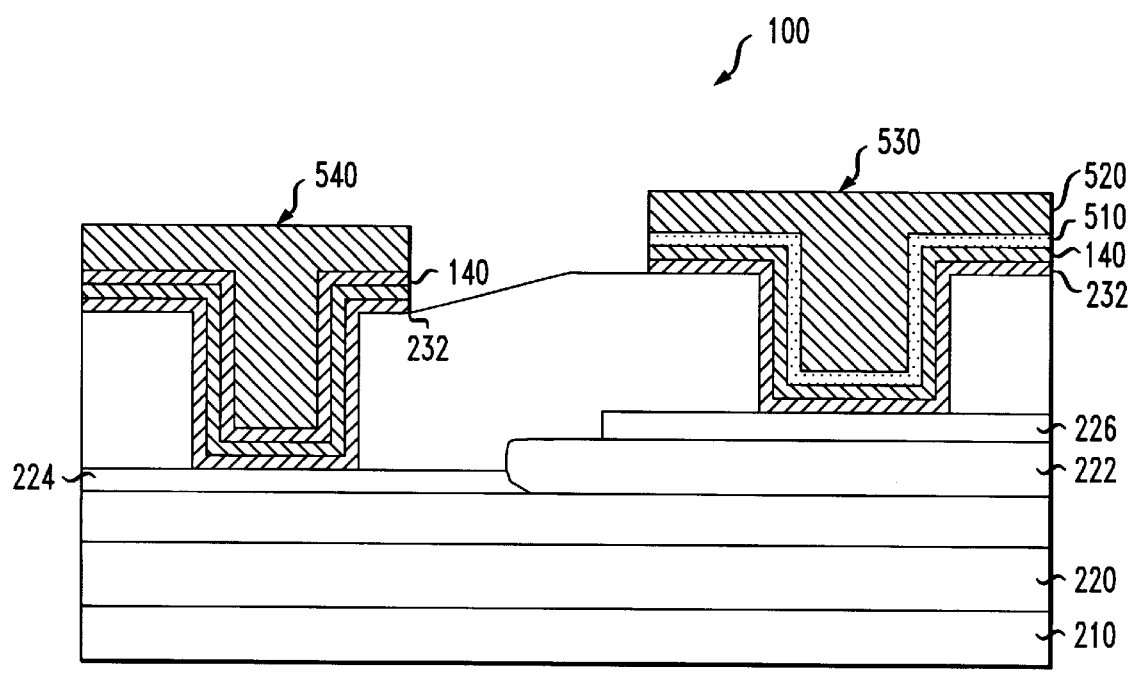
FIG. 6 illustrates a sectional view of an alternative embodiment of a semiconductor device at an intermediate stage of manufacture constructed according to the principles of the present invention.

As previously mentioned, the second metal layer 310 may be omitted as illustrated in FIG. 6. FIG. 6, illustrates a sectional view of the completed MOM capacitor 530 in contact with the transistor 225 as previously discussed. However, in this particular embodiment, the TiN layer has been omitted, leaving the metal silicide layer 410 formed over the Ti layer 232. In such embodiments, the metal silicide layer 410 may act as the diffusion barrier layer in place of the TiN layer. This particular aspect provides certain advantages. For example, the barrier layer thickness of the device (i.e., the layer 232 and the metal silicide layer 410) can be reduced. This reduction in thickness is attributable to the fact that the thicker TiN can be replaced by a thinner (e.g., from about 10 nm to about 30 nm) metal silicide layer 410 because of the superior barrier properties of the metal silicide layer 410. Additionally, these superior barrier properties may also allow higher temperature or longer time anneals after the metal stack deposition to help with hot carrier aging and matching characteristics of transistors. Another advantage is that the MOM capacitor's second electrode can be made thicker because the thicker TiN layer 232 can be replaced with a thinner metal silicide layer 410, which allows for better conductivity. Additionally, since the TiN is no longer present, the deglazing step may, again, be omitted, thereby, saving processing steps and expense.

Although the present invention has been described in detail, those skilled in the art should understand that they can make various changes, substitutions and alterations herein without departing from the spirit and scope of the invention in its broadest form.

What is claimed:

1. A metal oxide metal (MOM) capacitor located over a semiconductor wafer, comprising:
   a first metal layer located over the semiconductor wafer and within a contact opening;
   a metal silicide layer located on the first metal layer and within the contact opening;
   an oxide layer located on the metal silicide layer; and
   a second metal layer located on the oxide layer.

2. The MOM capacitor as recited in claim 1 wherein the metal silicide layer is resistant to a deglazing process.

3. The MOM capacitor as recited in claim 1 wherein the first metal layer comprises titanium.

4. The MOM capacitor as recited in claim 1 wherein the first metal layer includes a metal stack comprising a titanium nitride barrier layer formed over a titanium layer.

5. The MOM capacitor as recited in claim 1 wherein the oxide layer is a silane-based oxide layer.

6. The MOM capacitor as recited in claim 1 wherein the second metal layer comprises an aluminum layer, a copper layer, an aluminum/copper alloy layer or an aluminum/copper/silicon stack layer.

7. The MOM capacitor as recited in claim 1 wherein the metal silicide layer serves as an etch stop during fabrication of the MOM capacitor.

8. The MOM capacitor as recited in claim 1 wherein the metal silicide layer is a tungsten silicide layer.

9. The MOM capacitor as recited in claim 8 wherein the tungsten silicide layer is a tungsten silicide nitride layer.

10. The MOM capacitor as recited in claim 1 wherein the first and second metal layers are first and second electrodes of the MOM capacitor.

11. An integrated circuit formed on a semiconductor wafer, comprising:
    a transistor; and
    a metal oxide metal capacitor electrically connected to the transistor and includes:
       a first metal layer located over the semiconductor wafer and within a contact opening;
       a metal silicide layer located on the first metal layer and within the contact opening;
       an oxide layer located on the metal silicide layer; and
       a second metal layer located on the oxide layer.

12. The integrated circuit as recited in claim 11 wherein the metal silicide is resistive to a deglazing process.

13. The integrated circuit as recited in claim 11 wherein the first metal layer is a layer of titanium.

14. The integrated circuit as recited in claim 11 wherein the first metal layer is a metal stack comprising titanium nitride barrier layer formed over a titanium layer.

15. The integrated circuit as recited in claim 11 wherein the oxide layer is a silane-based oxide layer.

16. The integrated circuit as recited in claim 11 wherein the second metal layer comprises an aluminum layer, a copper layer, an aluminum/copper alloy layer or an aluminum/copper/silicon stack layer.

17. The integrated circuit as recited in claim 11 wherein the metal silicide acts as an etch stop during fabrication of the MOM capacitor.

18. The integrated circuit as recited in claim 11 wherein the metal silicide layer is a tungsten silicide layer.

19. The integrated circuit as recited in claim 18 wherein the tungsten silicide layer is a tungsten silicide nitride layer.

20. The integrated circuit as recited in claim 11 wherein the transistor is a CMOS transistor.

* * * * *